(12) United States Patent
Estevez

(10) Patent No.: US 7,170,828 B2
(45) Date of Patent: Jan. 30, 2007

(54) REMOVABLE FACE PLATE COMPRESSED DIGITAL MUSIC PLAYER

(75) Inventor: Leonardo W. Estevez, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 760 days.

(21) Appl. No.: 09/998,726

(22) Filed: Dec. 3, 2001

(65) Prior Publication Data

US 2002/0077834 A1 Jun. 20, 2002

Related U.S. Application Data

(60) Provisional application No. 60/255,855, filed on Dec. 15, 2000.

(51) Int. Cl.
 *H04B 1/20* (2006.01)

(52) U.S. Cl. .......................................... 369/2

(58) Field of Classification Search ................ 369/1, 369/2, 4, 6, 7, 10, 11, 12, 29.02, 21, 22, 15.01; 455/569.2, 572, 575.1, 575.9, 90.2, 90.3; 704/500, 501
See application file for complete search history.

(56) References Cited

U.S. PATENT DOCUMENTS

| | | | |
|---|---|---|---|
| 5,910,933 A * | 6/1999 | Moore | 369/2 |
| 6,052,603 A | 4/2000 | Brownfield et al. | |
| 6,061,306 A * | 5/2000 | Buchheim | 369/2 |
| 6,222,807 B1 * | 4/2001 | Min-Jae | 369/47.12 |
| 6,252,830 B1 * | 6/2001 | Hsu | 704/500 |
| 6,259,657 B1 * | 7/2001 | Swinney | 704/270 |
| 6,316,912 B1 * | 11/2001 | Murphy | 320/114 |
| 6,381,452 B1 * | 4/2002 | Tien et al. | 455/344 |
| 6,424,796 B2 * | 7/2002 | Flannery | 386/125 |
| 6,591,085 B1 * | 7/2003 | Grady | 455/42 |
| 6,606,281 B2 * | 8/2003 | Cowgill et al. | 369/11 |
| 6,629,000 B1 * | 9/2003 | Moon et al. | 700/94 |
| 6,631,098 B2 * | 10/2003 | Chang et al. | 369/7 |
| 6,791,481 B2 * | 9/2004 | Altare et al. | 341/55 |
| 2005/0054379 A1 * | 3/2005 | Cao et al. | 455/556.1 |

FOREIGN PATENT DOCUMENTS

| | | |
|---|---|---|
| EP | 0 924 708 A | 6/1999 |
| EP | 1 059 635 A | 12/2000 |
| JP | 11 259971 A | 12/1999 |
| WO | WO 00/31742 A | 6/2000 |

* cited by examiner

*Primary Examiner*—Tan Dinh
(74) *Attorney, Agent, or Firm*—Robert D. Marshall, Jr.; W. James Brady; Frederick J. Telecky, Jr.

(57) ABSTRACT

This invention comprises a two part audio system in which all of the processing power is allocated to a small, lightweight satellite part that is the face unit. Mass storage, amplification, and wired power for recharging the face unit is provided by the other part, the base. The base runs either from a 120 volts AC source or 12 volts DC. The face unit contains a small amount of flash memory making it capable of carrying music normally stored on two or more compact discs (CDS).

19 Claims, 2 Drawing Sheets

REMOVABLE FACE PLATE COMPRESSED DIGITAL MUSIC PLAYER

This application claims priority under 35 USC § 119(e)(1) of Provisional Application Number 60/255,855, filed Dec. 15, 2000.

TECHNICAL FIELD OF THE INVENTION

The technical field of this invention is compressed digital music players.

BACKGROUND OF THE INVENTION

Music and entertainment systems for the consumer have undergone enormous improvements in the last few decades. Equipment size as decreased from bulky and heavy to palm-size and extremely light weight. Media for storage in the form of cassette tapes and then compact discs has allowed an increasingly larger amount of songs and voice to be carried easily from place to place. Flash memory card storage and compressed audio formats have allowed additional breakthroughs. The consumer appetite for even more personal access to large volumes of audio clearly has invited increased use of hard disc storage and presented a need for Internet access even in inexpensive systems.

In recent years the specifications of the motion picture experts group (MPEG) have exerted a strong influence on all new design activity. The MPEG specifications relate to both picture and sound. MP3 audio, which is a specific MPEG layer 3 audio format, is becoming enormously popular as the audio format of choice for the future. Available MP3 players have already been introduced illustrating that the healthy appetite of many consumers can be satisfied with technology available, but the price may still be prohibitive.

In consumer electronics, however, additional product cost reduction is always needed. Lower costs translate to higher demand and more customers. New techniques for reducing cost will always be sought.

SUMMARY OF THE INVENTION

This invention comprises a two part removable face plate audio system in which all of the processing power is allocated to a small, lightweight satellite part that is the face unit. Mass storage, amplification, and wired power for recharging batteries in the face unit is provided by the other part, the base. It is contemplated that the base unit would be mounted in the dash of an automobile. As an alternative, the base unit could also be replicated for home use. In this alternative the base unit would run from a 120 volt AC source instead of 12 volt DC. The face unit could contain flash memory, perhaps a range of 64 to 128 Megabytes, making it capable of carrying music normally stored on two or more compact discs (CDS).

An important aspect of this system is the capability of quickly transferring music to and from the face unit via an AT parallel interface for example. A base unit designed for home use might also contain a CD player with an on screen display and a wired mechanism, examples being local area network LAN or digital subscriber line DSL. Such a wired mechanism would allow for downloading music directly from the Internet.

BRIEF DESCRIPTION OF THE DRAWINGS

These and other aspects of this invention are illustrated in the drawings, in which.

DETAILED DESCRIPTION OF PREFERRED EMBODIMENTS

This invention comprises a two part removable face plate audio system in which all of the processing power is allocated to a small, lightweight satellite part called the face unit. Mass storage, amplification, and wired power for recharging a battery in the face unit are provided by the other part, the base.

The MP3 face player provides a modular system for transporting MP3 encoded music from the PC to the car. The MP3 face player is small, light weight, and can be operated independent of the car base. The alternative to transferring the music to the car in this way is using some form of media like CDS. This requires a CD writer and is more time consuming than simply downloading to the face unit.

The MP3 face player also provides a means of transferring the music from the car base to another user stereo. If, for example, a consumer is attending a party, and someone would like to listen to some music the consumer has in his car, he can simply access the music at the face unit, remove the face unit and attach it to the party stereo for play. The economic impact of the removable face unit is that a separate portable player is not required. The same face unit can also be used as a portable player.

As another alternate design feature, an Internet connection like this could be implemented in the face player itself linking the product to a proprietary website. In the preferred embodiment the car unit might also contain a CD player capable of extracting MP3 music and storing to its own hard drive.

There are a number of reasons why such a model might be more interesting than a PC tethered model. Assume that the user is away from home, a situation that is a likely scenario in their car. A modem link might enable them to download any song from an Internet source, assuming that this music is not already stored in their car system. A possible mechanism for doing this would make use of the tuner keys to enter artist name and title and the liquid crystal display LCD to provide feedback.

Figure 1:
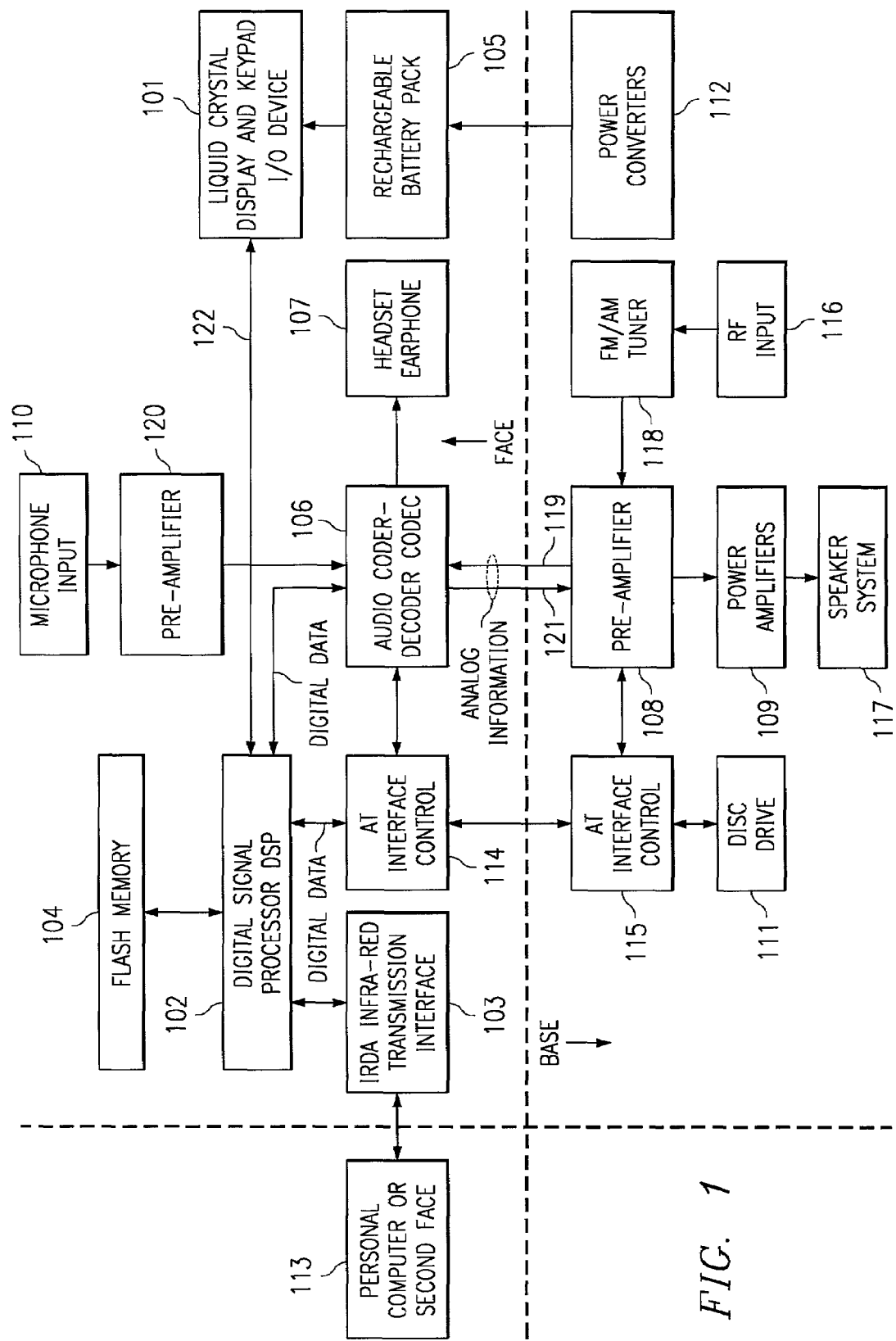
FIG. 1 illustrates the block diagram of a combination of a removable face plate MP3 player and a base unit of this invention.

In FIG. 1, the LCD/keypad I/O device 101 contains an LCD driver, an LCD, and push buttons mounted on the face plate to allow for user access and control. The digital signal processor 102 via path 122 accepts these user commands entered with the keyboard push buttons to a set of input registers holding the requested input. As an alternate, an LCD I/O interface chip or an ASIC integrated version could be used.

The LCD display is preferably alphanumeric and, along with the keyboard push buttons, enables the user to select specific songs or groups of songs for play sequencing. The controls are those common to commercially available MP3 players and FM car stereo systems.

The digital signal processor 102 in FIG. 1 is capable of decoding MP3 format information or information from other audio coder-decoders (codecs) in real time. A typical example would be a DSP such as the Texas Instruments TMS320C54. This DSP performs multiple functions including: MP3 decode; user I/O; LCD update; disk I/O; and infrared (IR) communications.

Infrared transmission interface (IRDA) 103 performs communications with other systems 113. These other systems 113 could be other face units, a face unit and a computer, or the face unit of another base unit. Data transmitted over the IR interface may be encoded or decoded. For encoded applications, MP3 data is transmitted between the face unit and other system 113 for local decode or storage. For decoded applications, the face unit may transmit typically 1.5 Megabits of per second digital stereo audio to another system for immediate play through a local audio coder-decoder broadcast. The IR interface ideally is IRDA 2.0 compliant enabling up to 4.0 Megabits communications between other face units or computers with IRDA compliant interfaces. The range on transmission of data is dependent on the data rate being used for transmission. Higher speed data rates will require closer ranges, i.e. 3 feet. Among several possibilities for PC interfacing might be universal serial bus USB, IEEE 1394, or another high-speed serial interface.

Flash memory 104 is nonvolatile and may have storage capacity of 32 or 64 Megabytes. An optional smart media or compact flash slot could be incorporated into the face unit for memory upgrade. The face unit reserves a portion of flash memory 104 for storing programs to accomplish face unit operating system boot and decoder software loading.

Rechargeable battery pack 105 is preferably of nickel-metal hydride composition. Rechargeable battery pack 105 automatically recharges via power converters 112 when connected to the base. There should be enough on board battery power within rechargeable battery pack 105 to provide several hours of un-tethered playback by the face unit.

Audio codec 106 is capable of converting compact disc quality digital stereo data into analog audio and contains enough amplification to drive an 8-ohm headset earphone 107. Headset earphone 107 is preferably connectable to the face unit via a standard audio plug. The resulting signal 121 produced by audio codec 106 may also serve as input signal for pre-amplifier 108 which drives the base unit power amplifier 109 and the speaker system 117. Pre-amplifier 108 receives volume setting information from the face unit either digitally via the 16-bit AT interfaces 114 and 115 or through a separately dedicated analog signal. This same signal can be used to control power to the face unit. Audio codec 106 is read from and written to directly by digital signal processor 102. Audio codec 106 is optionally capable of converting analog audio signal from microphone input 110 via preamplifier 120 into to digital data in the same fashion. This would permit digital recording of analog music received by tuner 118.

This makes the face unit capable of taking dictation or recording specific analog songs from a radio broadcast in real time. If analog song recording is implemented, the system could immediately store the digitized, uncompressed audio samples to base unit disk 111. Digital signal processor 102 may convert the music to MP3 format later for future retrieval. The digitized, uncompressed audio samples in this case could be bi-directionally transferred between the face unit and the base.

The tuner 118 of the base contains a standard FM/AM tuner with RF inputs 116 from an antenna. Tuner 118 produces analog audio preamp signals supplied to pre-amplifier 108. The user tunes the desired station via the face unit using LCD/keypad I/O device 101 and station selection is communicated to the tuner either through the 16-bit AT interfaces 114 and 115 or some alternative two wire interface such as IIC. Analog audio from tuner 118 is optionally coupled to audio coder-decoder 106 via analog connection 119.

Tuner 118 may optionally be capable of receiving compressed digital audio data. This data would then transmitted to the face unit through 16-bit AT interfaces 114 and 115. The face unit digital signal processor 102 would then decode the compressed data and play back the digital audio data through audio codec 106 to pre-amplifier 108.

Within the base, the disc drive 111 is preferably a standard small form factor drive operating in PIO mode 4 (DMA unsupported). The disc drive 111 is preferably capable of several gigabytes of storage. The interface between disc drive 111 and the face unit could be by 16-bit AT interfaces 114 and 115. Alternatively, the interface might be USB or IEEE 1394 and the face unit might have only this I/O interface. In this case the face unit may connect with a PC using this same interface that is used to interface to the drive at the base. The power converters 112 draw from the car onboard 12 volt DC source and produces the various voltages, such as 3.3 volts, 2.5 volts, 5 volts DC, as the face unit may require.

Figure 2:
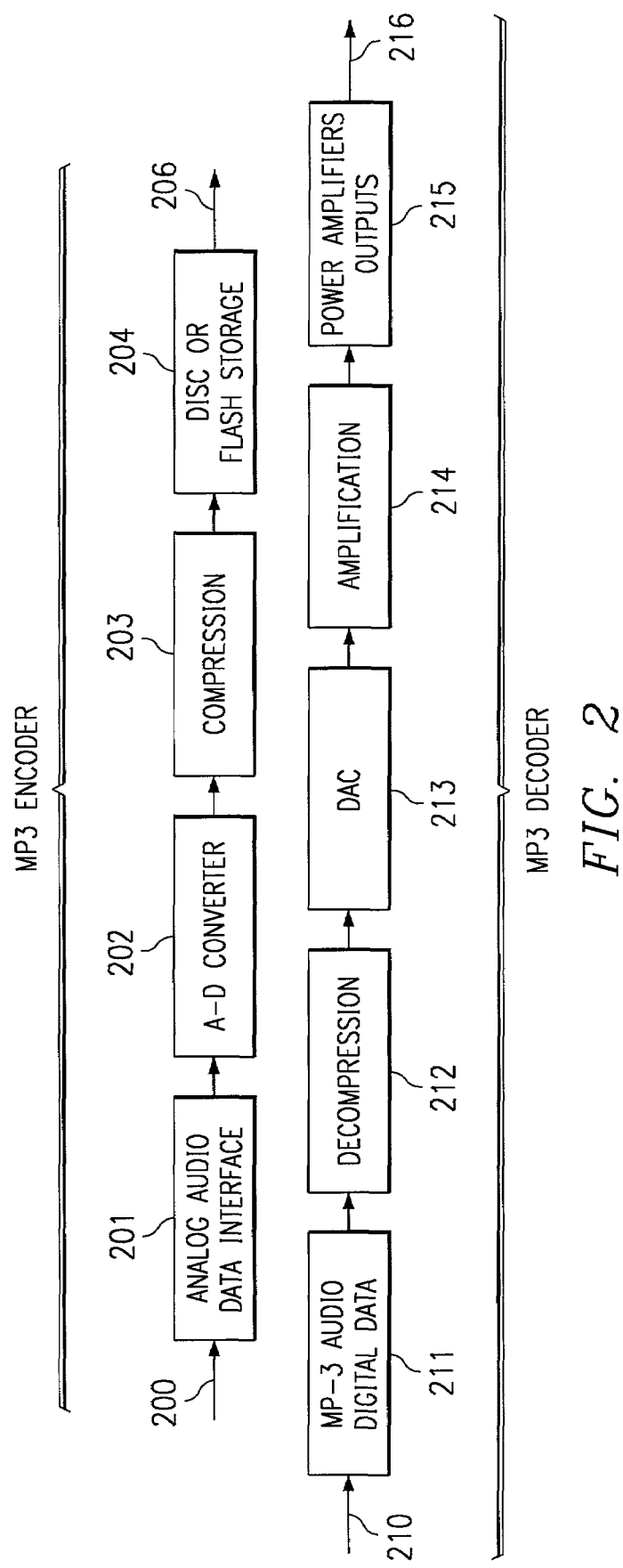
FIG. 2 illustrates the block diagram of the codec function within the MP3 player recorder of this invention.

Referring to FIG. 2, first note the upper portion of which illustrates a encoder block diagram for recorder applications. In the record mode, the MP3 device uses the encoder path, with audio input to be recorded entering at node 200. Block 201 is the analog audio data interface which amplifies the input signal and passes it to the analog to digital converter 202 for conversion to digital. After this conversion algorithms may be applied such as quantizing or removal of redundant data via run-length encoding in compression block 203.

The compression block 203 may or may not be MP3 encoding. It may be partial encoding because MP3 encoding requires significantly more processing than MP3 decoding. There are other encoding schemes that might be used in the compression block which are better adapted to speech compression such as G.711. It is also possible for the device to simply store the raw digital data during recording and dedicate the power of digital signal processor 102 to perform MP3 decode enabling the consumer to simultaneously listen to MP3 music while recording a program off the radio. Since MP3 or other compression methods which could be used are implemented in software, the desired compression can be performed when the user is listening to a tuned radio station or when the face unit is not actively used. The system would not necessarily perform run length encoding or quantization as a predecessor to MP3 encoding. It might use one of these techniques to store the data initially and subsequently, reload, decode, and recompress the data using MP3 techniques. Disc or FLASH memory 204 stores the compressed digital data form compression block 203 which may be output via node 206. Disc or FLASH memory 204 would typically be base disc drive 111 or FLASH memory 104.

The lower portion of FIG. 2 illustrates a decoder block diagram for player applications. In the play mode, the MP3 device uses this decoder path, with digital audio input to be decoded entering at node 210. This digital audio input would typically be from FLASH memory 104 or from the base disc drive 111 via 16-bit AT interfaces 114 and 115. Block 211 is the digital interface which receives the input digital signal and passes it to the decompression block 212 for conversion to full digital format with all data bits, even redundant ones present. After this decompression step is complete, the full digital audio is sent to digital to analog converter (DAC)

block 213 for digital to analog conversion. The analog data at this point is passed to the amplification block 214 and then the power amplifier stage 215 to generate sufficient drive for the speakers.

The present invention separates the face plate and the base portions of an MP3 player/recorder unit into two autonomous parts. This allows the user to have a totally portable MP3 unit with powerful application features at nominal cost. The inventor believes that this provides opportunities to develop products with otherwise unavailable market applications. This additional leverage give manufactures and marketers new tools to hold costs in line while providing the best performing products possible.

What is claimed is:

1. A music system comprising:
    a self-contained, portable music player including
        a rechargeable battery pack for powering the music player,
        an input device including at least a keypad for receiving user inputs;
        an output device including a display;
        a memory capable of storing digital music in at least one compressed digital format,
        a data processor connected to said input device, said output device and said memory, said data processor programmed to decompress said digital music into uncompressed digital music samples,
        an audio coder-decoder connected to said data processor for receiving said uncompressed digital music samples from said data processor and converting said uncompressed digital music samples into analog music,
        a headset connector connected to said audio coder-decoder for supplying said analog music, and
        a first base connector including
            a first power connection connected to said rechargeable battery pack capable of receiving charging power, and
            a player analog output connection connected to said audio coder-decoder for supplying said analog music, and
            an analog input connection connected to said audio coder-decoder for receiving an analog input; and
    a base unit including
        a second base connector including
            a second power connection for connection to said first power connection,
            an analog input connection for connection to said player analog output connection of said first base connector,
            a base unit analog output connection for connection to said analog input connection of said first base connector,
        a power source connected to said second power connection for supplying recharging power for said rechargeable battery pack,
        a pre-amplifier having an input connected to said analog input connection and an output,
        a power amplifier having an input connected to said output of said pre-amplifier and an output,
        a tuner for receiving and demodulating analog audio signals, said tuner supplying said analog audio signals to said base unit analog output connection, and
        a speaker system connected to said output of said power amplifier for reproducing sound corresponding to said output of said power amplifier, wherein the music system operates in
            a portable mode wherein said self-contained, portable music player is disconnected from said base unit and powered by said rechargeable battery pack, enabling a user to listen to selected digital music stored in said memory via said headset connector earphone, and
            in a base mode wherein said self-contained, portable music player is connected to said base unit via said first base connector and said second base connector and powered from said power source, enabling a user to listen to selected digital music stored in said memory via said speaker system of said base unit and enabling a user to listen to music from said tuner supplied to said analog input connection of said first base connector.

2. The music system of claim 1, wherein:
    said data processor is further programmed in cooperation with said input device enabling a user to enter volume control data via said keypad;
    said first base connector further includes a volume data output connection for transmission of volume control data from the self-contained, portable music player;
    said second base connector further includes a volume data input connection for connection to said volume data output connection; and
    said pre-amplifier is further connected to said volume data input connection and producing an amount of amplification corresponding to the volume control data.

3. A base unit for use with a self-contained, portable music player comprising:
    a tuner for receiving and demodulating analog audio signals;
    base connector including
        a power connection,
        an analog input connection for receiving an analog input,
        a base unit analog output connection connected to said tuner to output demodulated analog audio signals;
    a power source connected to said power connection for supplying recharging power for the self-contained, portable music player;
    a pre-amplifier having an input connected to said analog input connection and an output,
    a power amplifier having an input connected to said output of said pre-amplifier and an output, and
    a speaker system connected to said output of said power amplifier for reproducing sound corresponding to said output of said power amplifier.

4. The base unit of claim 3, wherein:
    said base connector further includes a volume data input connection for receiving of volume control data from the self-contained, portable music player;
    said pre-amplifier is further connected to said volume data input connection and producing an amount of amplification corresponding to the volume control data.

5. The music system of claim 1, wherein:
    said self-contained, portable music player wherein
        said first base connector further includes a first digital data bus connection for bidirectional data exchange and
        said data processor being further connected to said first digital data bus connection of said base connector for communicating station selection data corresponding to inputs received from said input device via said first digital data bus connection to the base unit;
    said base unit wherein
        said second base connector further includes a second digital data bus connection for connection to said first digital data bus connection for receiving digital data including station selection data, and said tuner being connected to said second digital data bus connection and further selecting a station corresponding to said station selection data.

6. The base unit of claim 3, wherein:

said base connector further includes a digital data bus connection for receiving digital data including station selection data; and said tuner being connected to said digital data bus connection and further selecting a station corresponding to said station selection data.

7. The music system of claim 2, wherein:
said base unit includes no volume control input.

8. The base unit of claim 4, wherein:
said base unit includes no volume control input.

9. The music system of claim 5, wherein:
said base unit includes no station selection input.

10. The base unit of claim 6, wherein:
said base unit includes no station selection input.

11. A self-contained, portable music player comprising:

a rechargeable battery pack for powering the music player;

an input device including at least a keypad for receiving user inputs;

an output device including a display;

a memory capable of storing digital music in at least one compressed digital format;

a data processor connected to said input device, said output device and said memory, said data processor programmed to decompress said digital music into uncompressed digital music samples, said data processor further programmed in cooperation with said input device enabling a user to enter volume control data via said keypad;

an audio coder-decoder connected to said data processor for receiving said uncompressed digital music samples from said data processor and converting said uncompressed digital music samples into analog music;

a headset connector connected to said audio coder-decoder for supplying said analog music; and a base connector including
a power connection connected to said rechargeable battery pack capable of receiving charging power,
an analog output connection connected to said audio coder-decoder for supplying said analog music for amplification and reproduction via speakers, and
a volume control data output connection for transmission of volume control data from the self-contained, portable music player; and wherein the self-contained, portable music player operates in
portable mode disconnected from a base unit and powered by said rechargeable battery pack, enabling a user to listen to selected digital music stored in said memory via said headset connector, and
in a base mode connected to a base unit via said base connector and powered via said power connector, enabling a user to listen to selected digital music stored in said memory via said analog output connection and control listening volume via said volume control data.

12. The self-contained, portable music player of claim 11, wherein:

said base connector further includes a station selection data output connection; and said data processor being further programmed in cooperation with said input device enabling a user to enter station selection data via said keypad, said data processor being further connected to said station selection data output connection of said base connector for communicating station selection data corresponding to inputs received from said input device via said station selection output connection.

13. A music system comprising:
a self-contained, portable music player including
a rechargeable battery pack for powering the music player,
an input device including at least a keypad for receiving user inputs;
an output device including a display;
a memory capable of storing digital music in at least one compressed digital format,
a data processor connected to said input device, said output device and said memory, said data processor programmed to decompress said digital music into uncompressed digital music samples, said data processor further programmed in cooperation with said input device enabling a user to enter volume control data via said keypad,
an audio coderdecoder connected to said data processor for receiving said uncompressed digital music samples from said data processor and converting said uncompressed digital music samples into analog music,
a headset connector connected to said audio coder-decoder for supplying said analog music, and
a first base connector including
a first power connection connected to said rechargeable battery pack capable of receiving charging power,
a player analog output connection connected to said audio coder-decoder for supplying said analog music, and
a volume control data output connection for transmission of volume control data from the self-contained, portable music player; and a base unit including
a second base connector including
a second power connection for connection to said first power connection,
an analog input connection for connection to said player analog output connection of said first base connector,
a volume control data input connection for connection to said player volume control data output connection of said first base connector,
a power source connected to said second power connection for supplying recharging power for said rechargeable battery pack,
a pre-amplifier having an input connected to said analog input connection and an output, said pre-amplifier further connected to said volume control data input connection and producing an amount of amplification corresponding to the volume control data,
a power amplifier having an input connected to said output of said pre-amplifier and an output,
a speaker system connected to said output of said power amplifier for reproducing sound corresponding to said output of said power amplifier, said base unit having no input for volume control; and
wherein the music system operates in
a portable mode wherein said self-contained, portable music player is disconnected from said base unit and powered by said rechargeable battery pack, enabling a user to listen to selected digital music stored in said memory via said headset connector, and
in a base mode wherein said self-contained, portable music player is connected to said base unit via said first base connector and said second base connector and powered from said power source, enabling a user to listen to selected digital music stored in said memory via said speaker system of said base unit and control listening volume via said volume control data.

14. The music system of claim 13, wherein:
said self-contained portable music player wherein
said first base connector further includes a station selection data output connection, and
said data processor being further programmed in cooperation with said input device enabling a user to enter station selection data via said keypad, said data processor being further connected to said station selection data output connection of said first base connector for communicating station selection data corresponding to inputs received from said input device via said station selection output connection;
said base unit wherein
said second base connector further includes a station selection data input connection for connection to said player station selection data output connection of said first base connector,
said base unit further including a tuner for receiving and demodulating analog audio signals and connected to said station selection data input connection of said second base connector for selecting a station corresponding to said station selection data; and
said base unit having no input for station selection.

15. A base unit for use with a self-contained, portable music player comprising:
a base connector including
a power connection,
an analog input connection for receiving an analog input,
a volume control data input connection for receiving volume control data;
a power source connected to said power connection for supplying recharging power for the self-contained, portable music player;
a pre-amplifier having an input connected to said analog input connection and an output, said pre-amplifier further connected to said volume control data input connection and producing an amount of amplification corresponding to the volume control data;
a power amplifier having an input connected to said output of said pre-amplifier and an output;
a speaker system connected to said output of said power amplifier for reproducing sound corresponding to said output of said power amplifier;
said base unit having no input for volume control.

16. The base unit of claim 15, wherein:
said base connector further includes a station selection data input connection for receiving station selection data;
said base unit further including a tuner for receiving and demodulating analog audio signals and connected to said station selection data input connection of said base connector for selecting a station corresponding to said station selection data; and
said base unit having no input for station selection.

17. A self-contained, portable music player comprising:
a rechargeable battery pack for powering the music player;
an input device including at least a keypad for receiving user inputs;
an output device including a display;
a memory capable of storing digital music in at least one compressed digital format;
a data processor connected to said input device, said output device and said memory, said data processor programmed to decompress said digital music into uncompressed digital music samples, said data processor further programmed in cooperation with said input device enabling a user to enter station selection data via said keypad;
an audio coder-decoder connected to said data processor for receiving said uncompressed digital music samples from said data processor and converting said uncompressed digital music samples into analog music;
a headset connector connected to said audio coder-decoder for supplying said analog music; and
a base connector including
a power connection connected to said rechargeable battery pack capable of receiving charging power,
an analog output connection connected to said audio coder-decoder for supplying said analog music for amplification and reproduction via speakers, and
a station selection data output connection for transmission of station selection data from the self contained, portable music player; and
wherein the self-contained, portable music player operates in
a portable mode disconnected from a base unit and powered by said rechargeable battery pack, enabling a user to listen to selected digital music stored in said memory via said headset connector, and
in a base mode connected to a base unit via said base connector and powered via said power connector, enabling a user to listen to selected digital music stored in said memory via said analog output connection and control station selection of a tuner via said station selection data.

18. A music system comprising:
a self-contained, portable music player including
a rechargeable battery pack for powering the music player,
an input device including at least a keypad for receiving user inputs;
an output device including a display;
a memory capable of storing digital music in at least one compressed digital format,
a data processor connected to said input device, said output device and said memory, said data processor programmed to decompress said digital music into uncompressed digital music samples, said data processor further programmed in cooperation with said input device enabling a user to enter station selection data via said keypad,
an audio coder-decoder connected to said data processor for receiving said uncompressed digital music samples from said data processor and converting said uncompressed digital music samples into analog music, a headset connector connected to said audio coder-decoder for supplying said analog music, and a first base connector including a first power connection connected to said rechargeable battery pack capable of receiving charging power, a player analog output connection connected to said audio coder-decoder for supplying said analog music, and a station selection data output connection for transmission of station selection data from the self-contained, portable music player; and a base unit including a second base connector including a second power connection for connection to said first power connection, an analog input connection for connection to said player analog output connection of said first base connector, a station selection data input connection for connection to said player station selection data output connection of said first base connector, a power source connected to said second power connection for supplying recharging power for said rechargeable battery pack, a pre-amplifier having an input connected to said analog input connection and an output, a power amplifier having an input connected to said output of said pre-amplifier and an output, a speaker system connected to said output of said power amplifier for reproducing sound corresponding to said output of said power amplifier, a tuner for receiving and demodulating analog audio signals and connected to said station selection data input connection of said second base connector for selecting a station corresponding to said station selection data; and said base unit having no input for station selection; and wherein the music system operates in a portable mode wherein said self-contained, portable music player is disconnected from said base unit and powered by said rechargeable battery pack, enabling a user to listen to selected digital music stored in said memory via said headset connector, and in a base mode wherein said self-contained, portable music player is connected to said base unit via said first base connector and said second base connector and powered from said power source, enabling a user to listen to selected digital music stored in said memory via said speaker system of said base unit and control station selection of the tuner via said station selection data entered via said portable music player input device.

19. A base unit for use with a self-contained, portable music player comprising:

a base connector including a power connection, an analog input connection for receiving an analog input, a station selection data input connection for receiving station selection data;

a power source connected to said power connection for supplying recharging power for the self-contained, portable music player;

a pre-amplifier having an input connected to said analog input connection and an output;

a power amplifier having an input connected to said output of said pre-amplifier and an output;

a speaker system connected to said output of said power amplifier for reproducing sound corresponding to said output of said power amplifier;

a tuner for receiving and demodulating analog audio signals and connected to said station selection data input connection of said base connector for selecting a station corresponding to said station selection data; and said base unit having no input for station selection.

* * * * *